United States Patent
Tang et al.

(10) Patent No.: US 12,057,189 B2
(45) Date of Patent: Aug. 6, 2024

(54) CHIP SELECT, COMMAND, AND ADDRESS ENCODING

(71) Applicant: SanDisk Technologies LLC, Addison, TX (US)

(72) Inventors: Tianyu Tang, Milpitas, CA (US); Siddhesh Darne, Milpitas, CA (US); Venkatesh Prasad Ramachandra, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 144 days.

(21) Appl. No.: 17/828,921

(22) Filed: May 31, 2022

(65) Prior Publication Data

US 2023/0386531 A1 Nov. 30, 2023

(51) Int. Cl.
| | |
|---|---|
| *G11C 7/10* | (2006.01) |
| *G11C 7/22* | (2006.01) |
| *G11C 8/10* | (2006.01) |
| *G11C 8/12* | (2006.01) |

(52) U.S. Cl.
CPC ............ *G11C 7/1039* (2013.01); *G11C 7/106* (2013.01); *G11C 7/1063* (2013.01); *G11C 7/1087* (2013.01); *G11C 7/109* (2013.01); *G11C 7/222* (2013.01); *G11C 8/10* (2013.01); *G11C 8/12* (2013.01)

(58) Field of Classification Search
CPC ..... G11C 7/1039; G11C 7/106; G11C 7/1063; G11C 7/1087; G11C 7/109; G11C 7/222
See application file for complete search history.

(56) References Cited

U.S. PATENT DOCUMENTS

| | | | | |
|---|---|---|---|---|
| 2002/0003748 | A1* | 1/2002 | Fujita | G11C 7/1072 365/233.1 |
| 2014/0112073 | A1* | 4/2014 | Ikeda | G06F 12/0246 365/185.11 |

* cited by examiner

*Primary Examiner* — Jay W. Radke
(74) *Attorney, Agent, or Firm* — Sheppard, Mullin, Richter & Hampton LLP

(57) ABSTRACT

A command/address sequence associated with a read/write operation for a memory device utilizes various existing command/address clock signals in a novel way that obviates the need to utilize the I/O bus. As such, the command/address sequence can be performed in parallel with the DIN/DOUT operations, thereby removing the performance bottleneck that would otherwise be caused by the command and address sequencing. The command/address sequence encodes bit information on first and second enable signals and utilizes rising or falling edges of a clock signal to latch the encoded bit information, which can then be decoded to determine corresponding command and address codes. A chip select sequence is also disclosed that enables a memory chip configuration to be employed in which each chip in a package shares a common connection to a controller but does not require hard-coded pins for performing chip select.

16 Claims, 21 Drawing Sheets

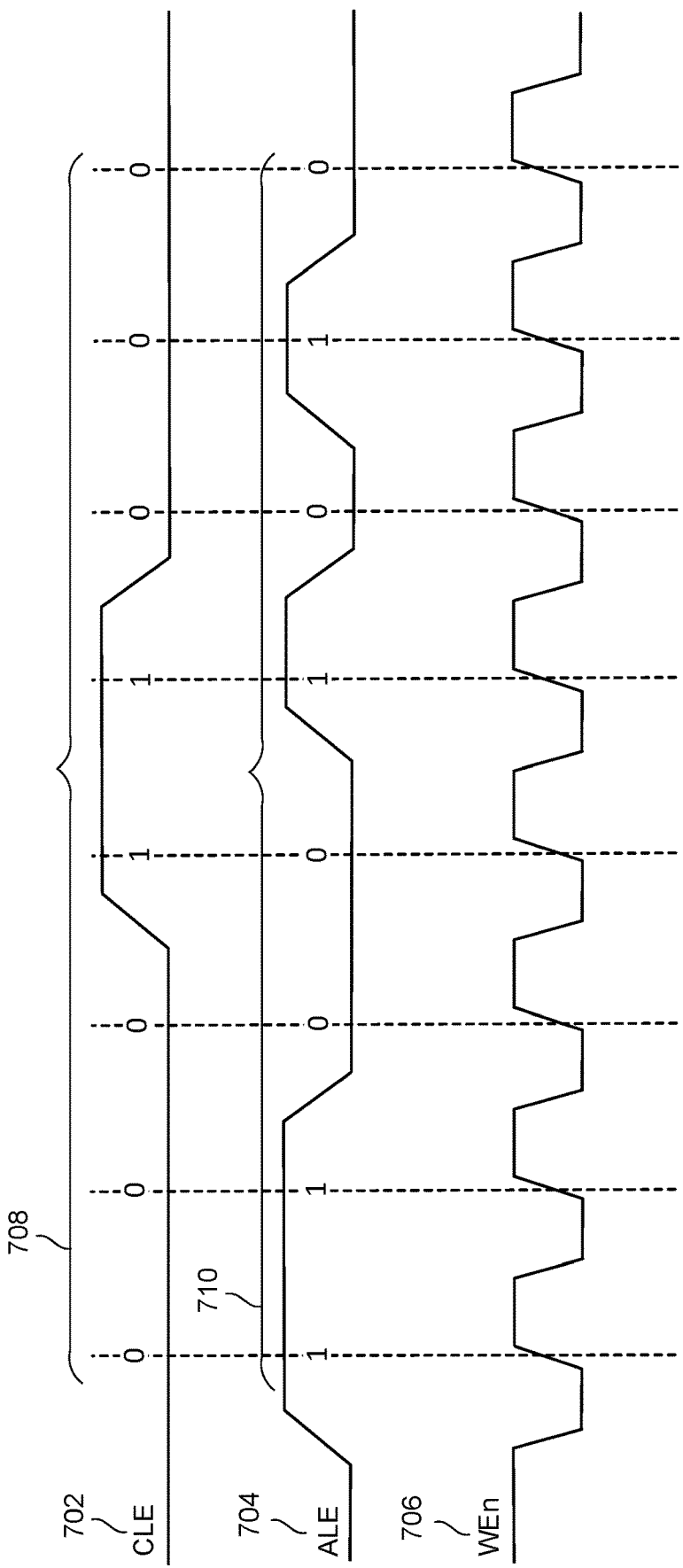

CHIP SELECT, COMMAND, AND ADDRESS ENCODING

BACKGROUND

Flash memory is an electronic, non-volatile computer memory storage medium that can be electrically erased and reprogrammed. Flash memory is now widely used across a range of products and industries including computers, smartphones, tablets, digital audio players, digital cameras, wearable devices, video games, scientific instrumentation, industrial robotics, medical electronics, and so forth. NAND flash memory—one of the two primary types of flash memory—has become the preferred choice of flash memory for memory cards, USB flash drives, solid-state drives, and the like. NAND flash may connect floating gate transistors (e.g., floating gate metal-oxide-semiconductor field-effect transistors (MOSFETs)) or transistors that include a charge trapping layer (CTL) in a manner that resembles a NAND logic gate to form memory cells that can be programmed to store bit information. In particular, the bit information is stored as the threshold voltages of the transistors of the cells. Various types of NAND flash technology exist and differ with respect to the number of programmable states they support, and thus, the number of bits of information that an individual memory cell can store.

In connection with an operation to write data to a NAND device or an operation to read data there from, a controller may perform a command and address sequence to inform the NAND device of the type of operation to be performed (e.g., read or write operation) prior to the data actually being written to or read from the NAND. The time to perform the command and address sequence can be a limiting factor to overall NAND performance.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 7A schematically depicts a command/address sequence in accordance with example embodiments of the disclosed technology.

Figure 1:
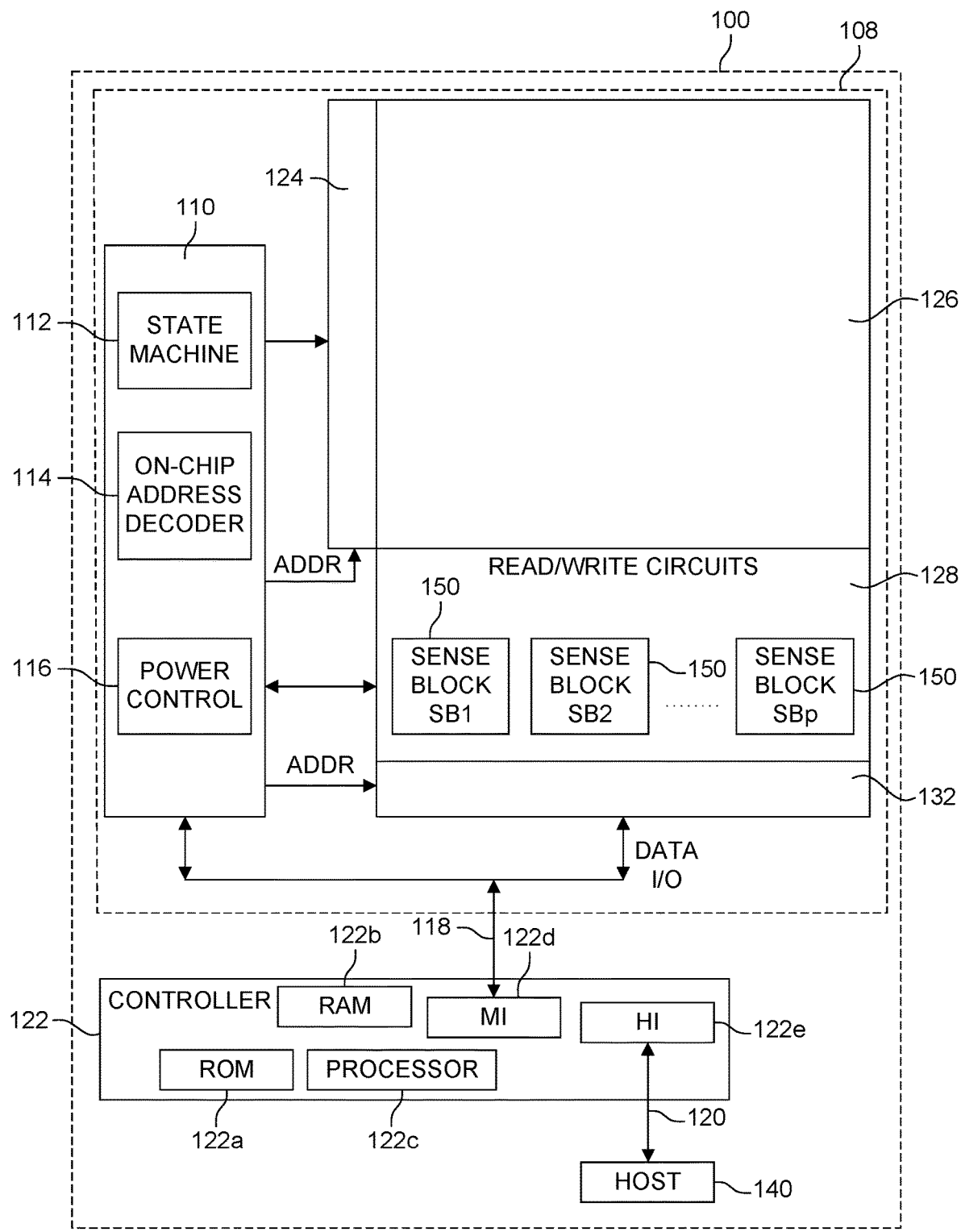
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

Data IN (DIN) and data OUT (DOUT) speeds for write and read operations for memory devices (e.g., a NAND flash device) continue to increase. Similar performance gains, however, have not been achievable with respect to command and addressing sequencing. As such, the command and addressing sequencing time remains a bottleneck for overall system timing. While the command/addressing speed can be increased to some degree, the extent of the increase that can be achieved is limited. Moreover, this approach is not scalable.

Embodiments of the disclosed technology relate to systems, devices, circuits, methods, computer-readable media, and techniques for performing a command/address sequence associated with a write operation or a read operation (referred to alternatively herein as a read/write operation) for a memory device that does not require the input/output (I/O) bus, and thus, can be performed in parallel with DIN/DOUT operations. According to example embodiments of the disclosed technology, the command/address sequence utilizes various existing command/address clock signals in a novel way that obviates the need to utilize the I/O bus. As such, a command/address sequence according to embodiments of the disclosed technology can be performed in parallel with the DIN/DOUT operations, thereby removing the performance bottleneck that would otherwise be caused by the command and address sequencing, and providing a technical solution to a technical problem associated with existing command and address sequencing.

In an example embodiment of the disclosed technology, a clock generator generates first, second, and third clock signals, which may be clock signals used in connection with existing command and address sequencing techniques. For instance, the first clock signal may be a command latch enable clock signal, the second clock signal may be an address latch enable signal, and the third clock signal may be a write enable clock signal. However, in contrast to these existing command and address sequencing techniques, the first and second clock signals may encode bit information that a controller can detect using the third clock signal, and decode to ascertain corresponding command and address codes. More specifically, in an example embodiment, the controller causes, at a rising or falling edge of a third clock signal, respective bit values encoded on the first and second clock signals to be latched in order to obtain a first bit pattern and a second bit pattern, respectively. The controller is configured to then decode the first bit pattern as a command code and the second bit pattern as an address code. In this manner, a command/address sequence according to embodiments of the disclosed technology can be performed without the I/O bus, thereby allowing the command and address sequencing to be performed in parallel with DIN/DOUT operations. More specifically, in some embodiments, a command/address sequence corresponding to a next read/write operation can be performed in parallel with a DIN/DOUT operation corresponding to a current read/write operation.

Embodiments of the disclosed technology also relate to systems, devices, circuits, methods, computer-readable media, and techniques for performing a chip select sequence that also does not require the I/O bus, and thus, can similarly be performed in parallel with DIN/DOUT operations. In an example embodiment of the disclosed technology, a clock generator may generate a first clock signal and a second clock signal, which may be, for instance, a chip enable clock signal and a write enable clock signal, respectively. During a reset phase of operation, a controller may cause a bit value encoded in the first clock signal to be latched at each rising/falling edge of the second clock signal in order to obtain a first bit pattern. The controller may then decode this first bit pattern to determine if it matches a reset indicator.

If the first bit pattern matches the reset indicator, the chip select sequence transitions to a selection phase. During the selection phase, the controller may cause a bit value encoded in the first clock signal to be latched at each rising/falling edge of the second clock signal in order to obtain a second bit pattern. The controller may then decode the second bit pattern to determine a particular corresponding memory chip to select for the chip enable function. The controller may decode the second bit pattern based on a predefined association between the second bit pattern and a particular memory chip within a memory package. In this manner, a chip select sequence according to embodiments of the disclosed technology enables a chip select/enable function to be performed without requiring the I/O bus, and thus, in parallel with DIN/DOUT operations. Furthermore, the chip select sequence disclosed herein enables a chip select configuration to be employed in which each chip in a package shares a common connection to a controller but does not require the hard-coded pins that otherwise would be required to enable chip select for such a configuration.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c—may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
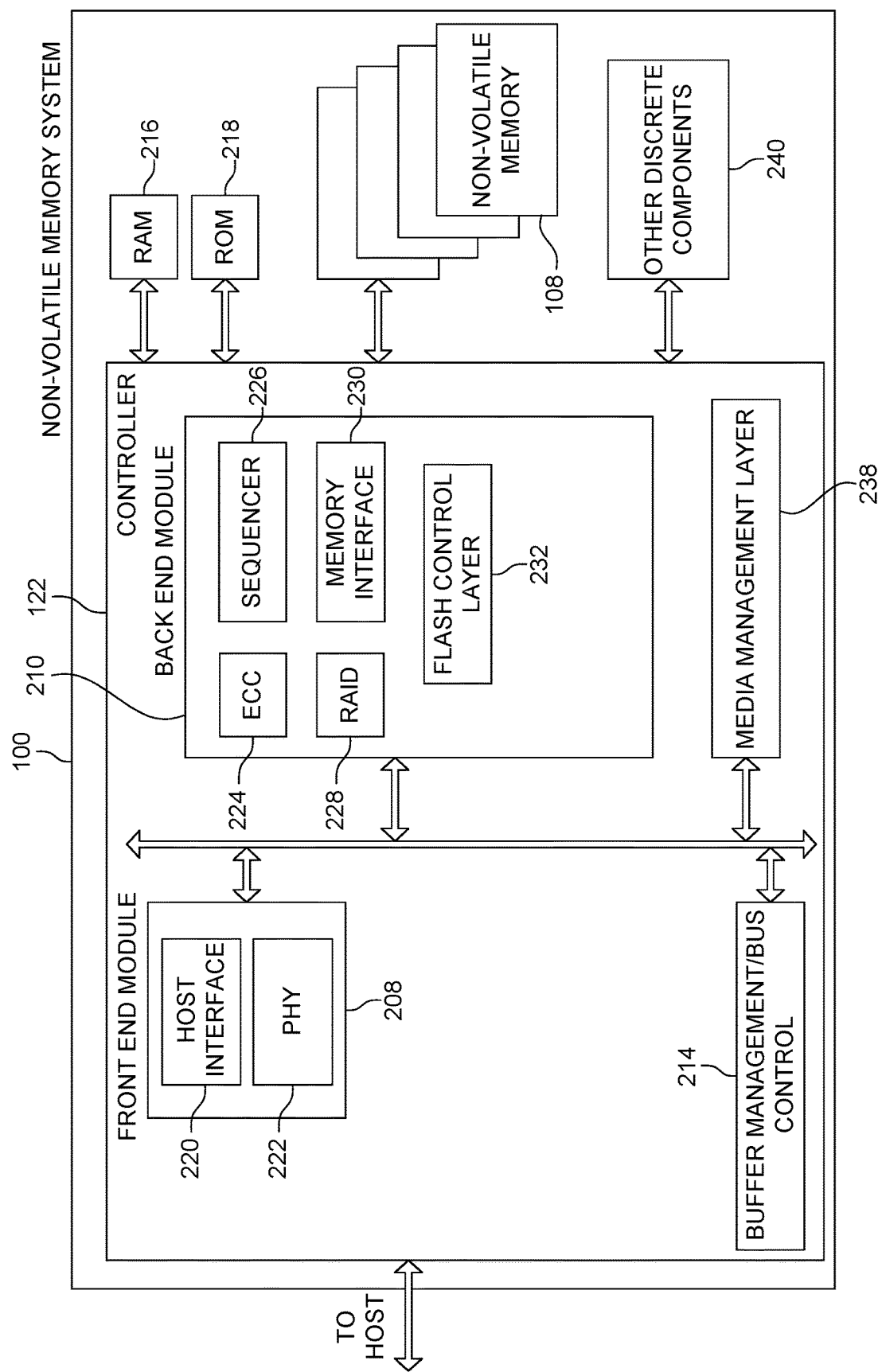
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
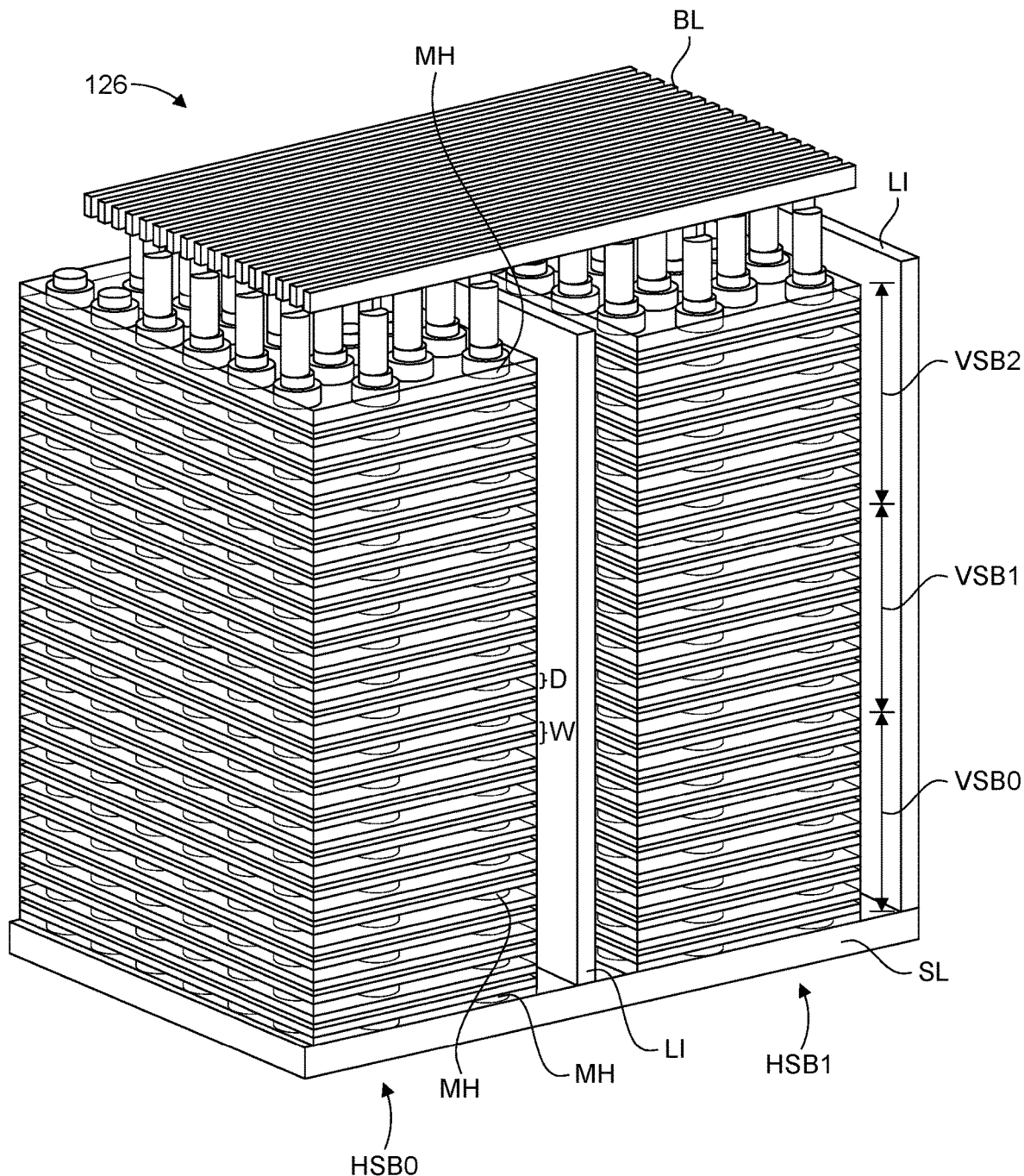
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
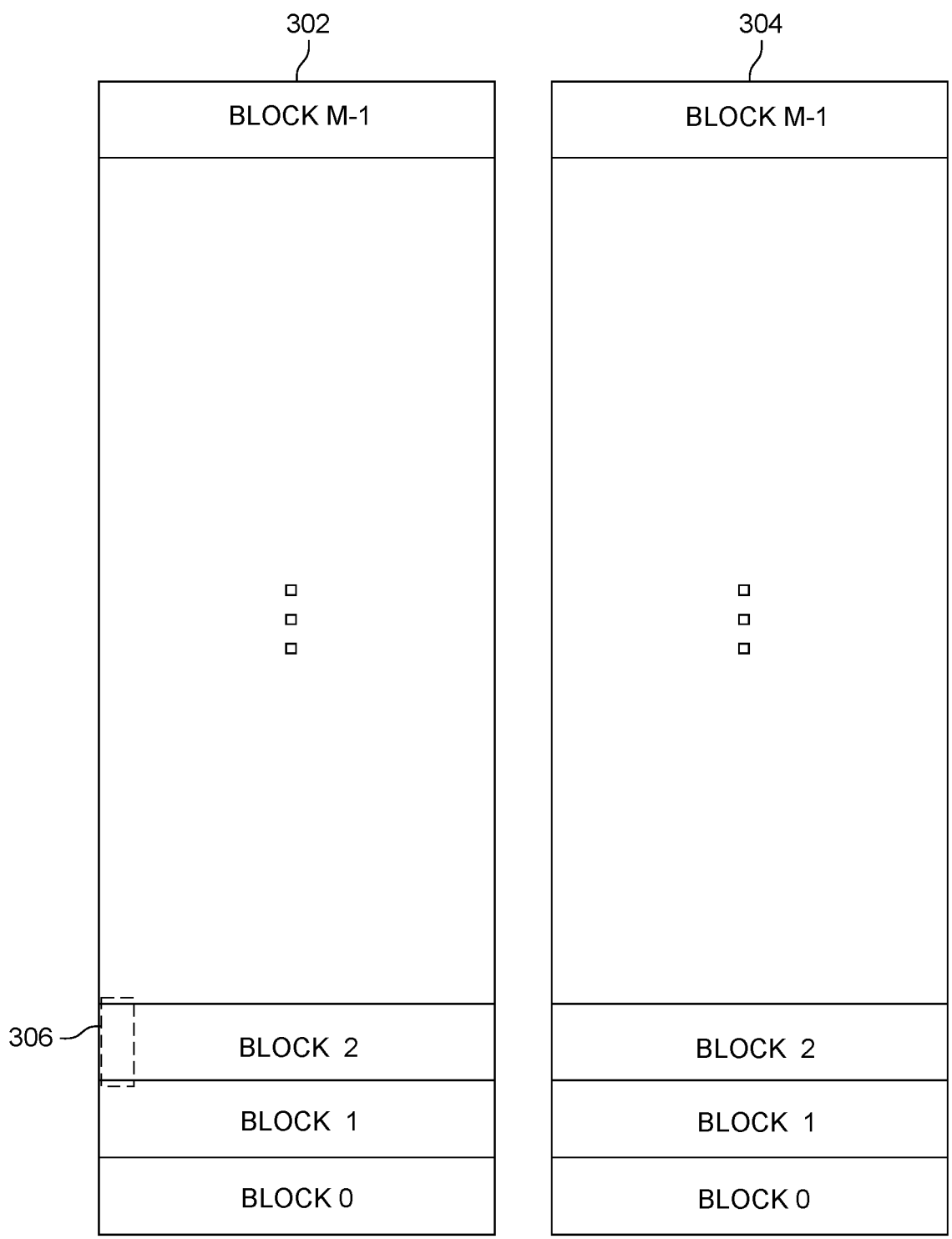
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
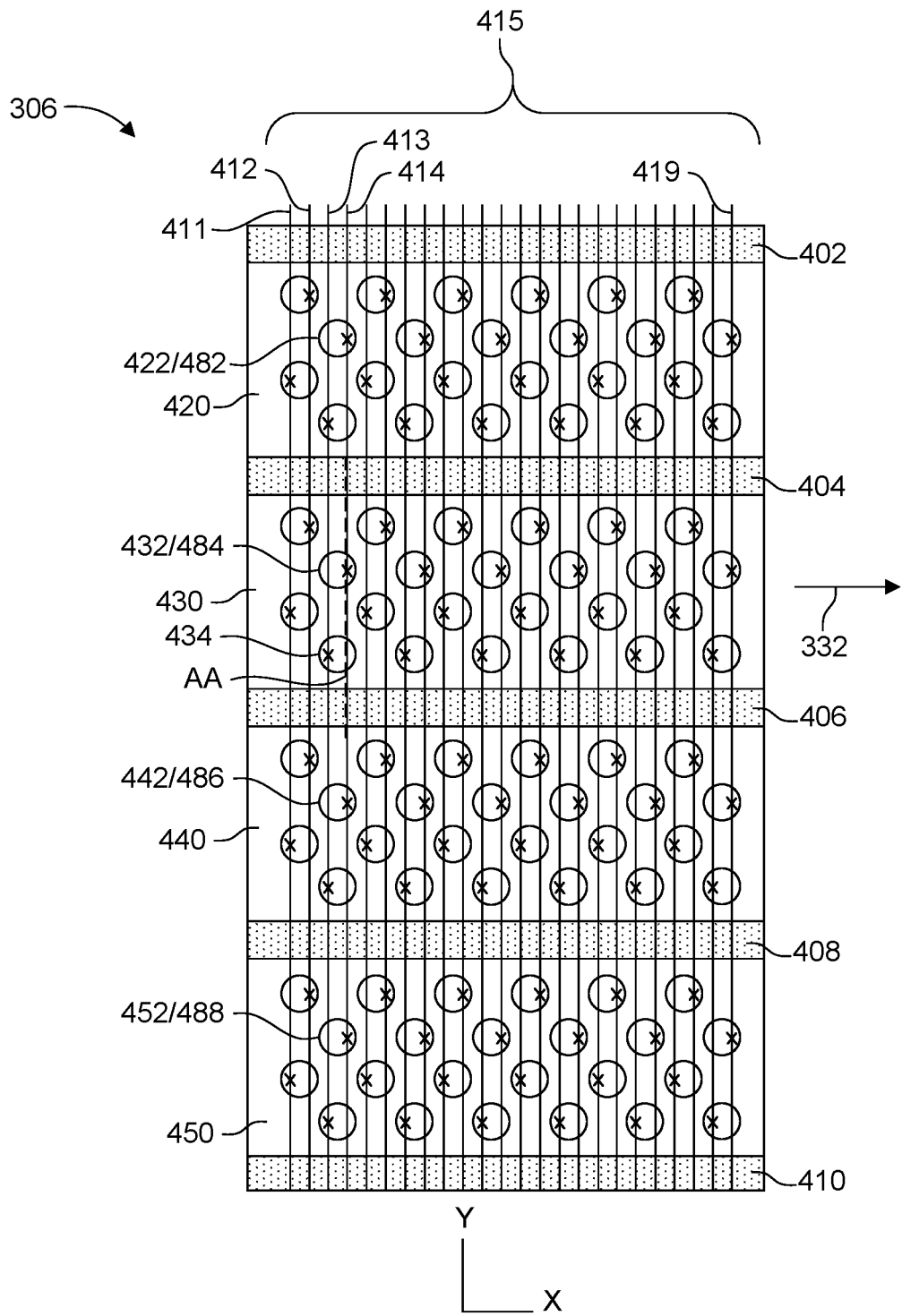
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
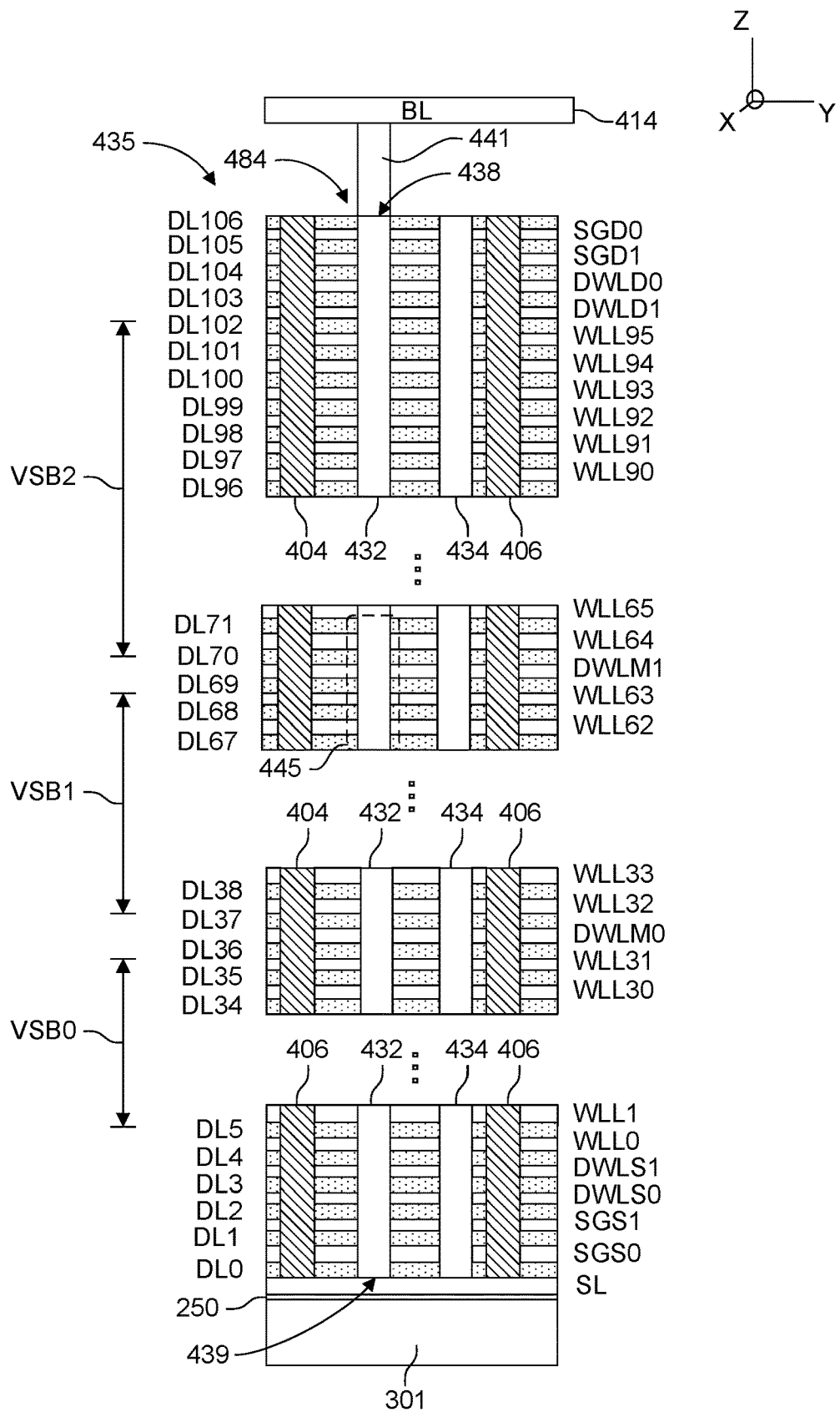
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
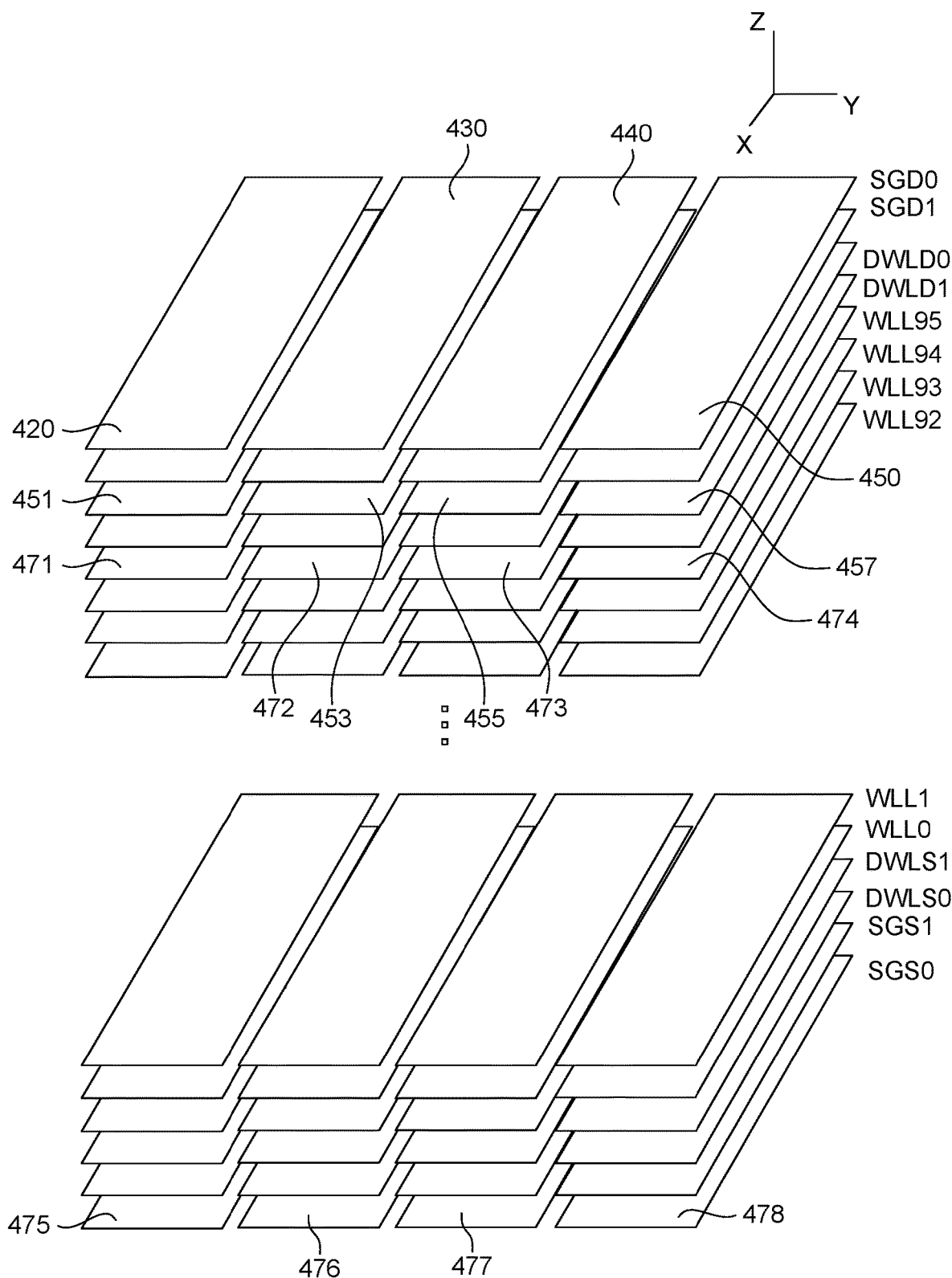
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
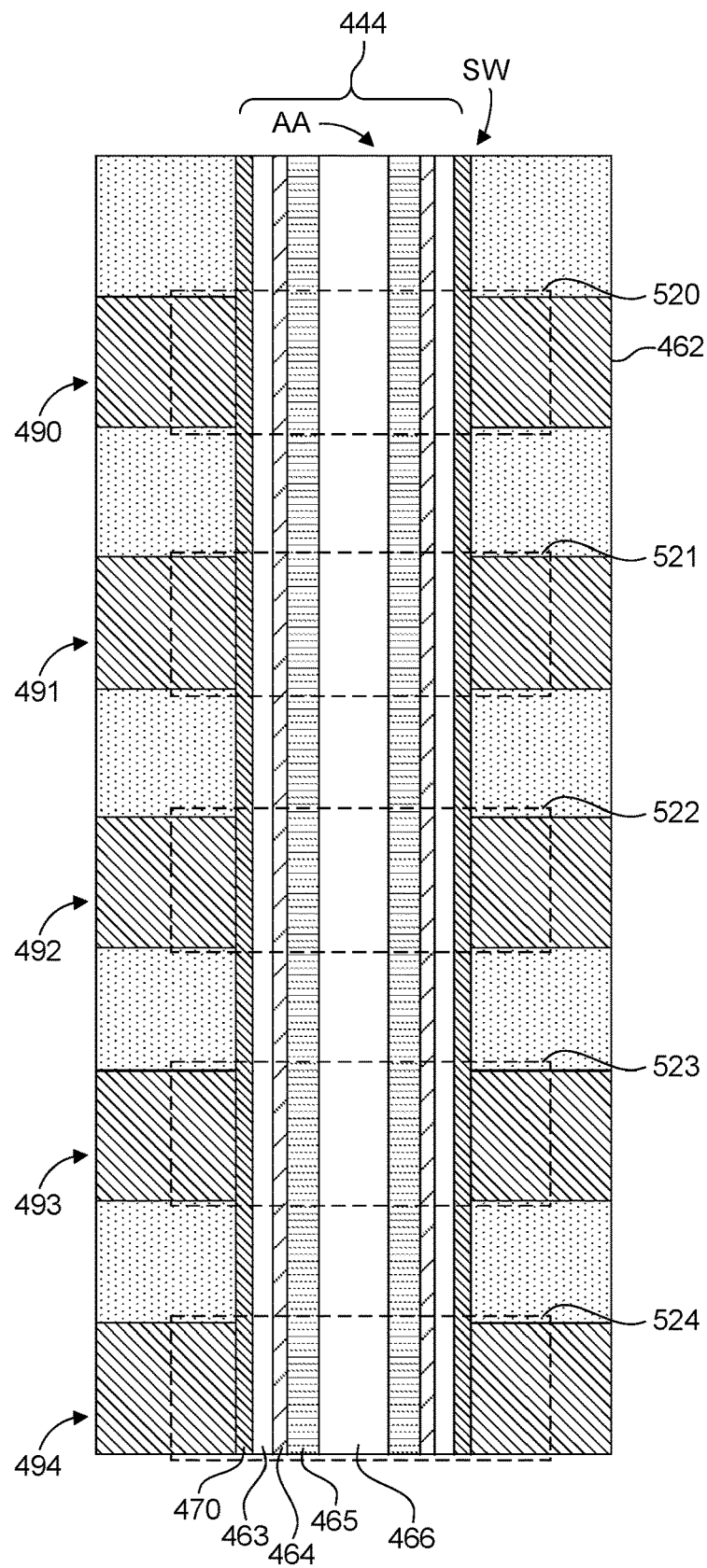
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
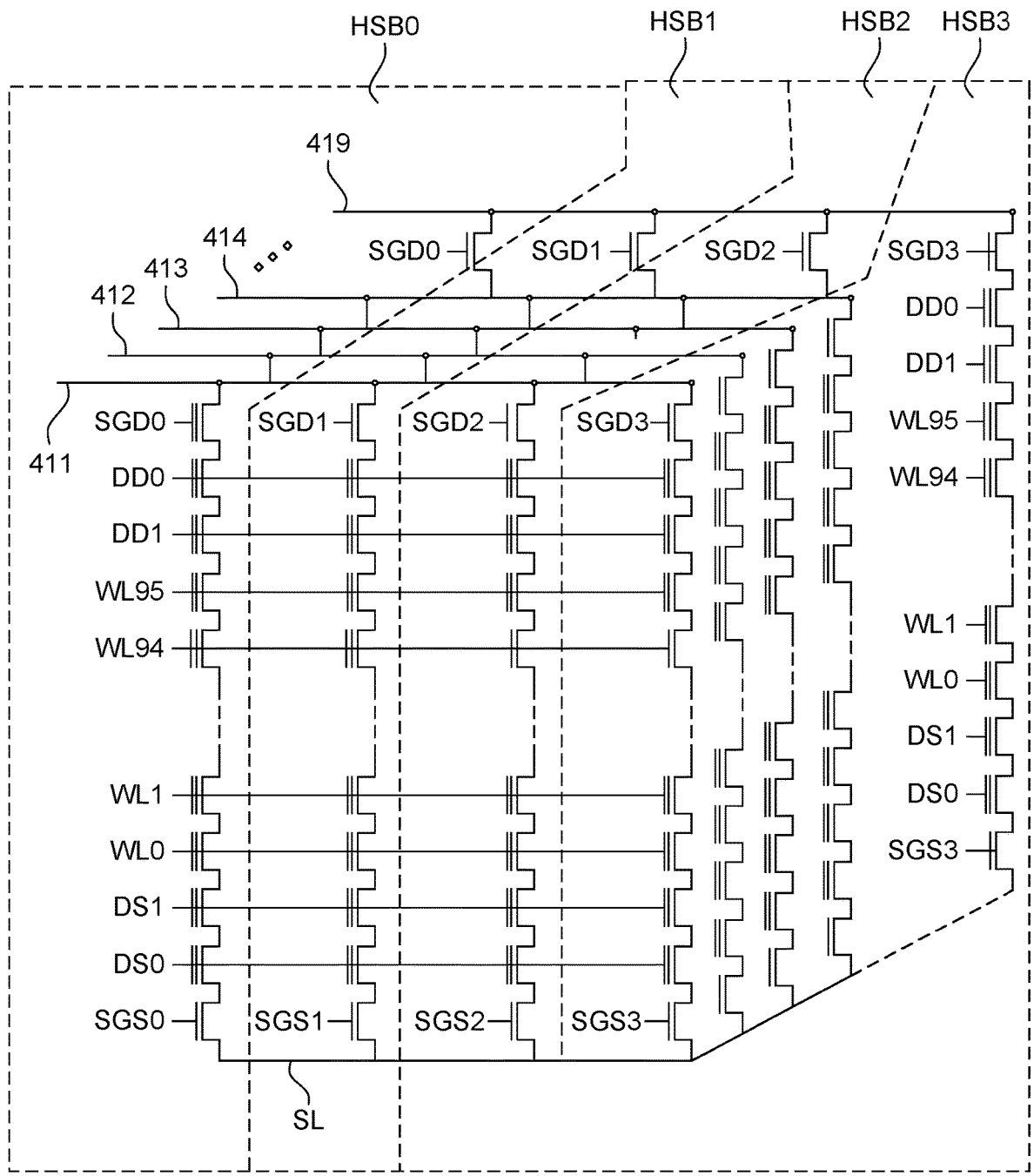
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
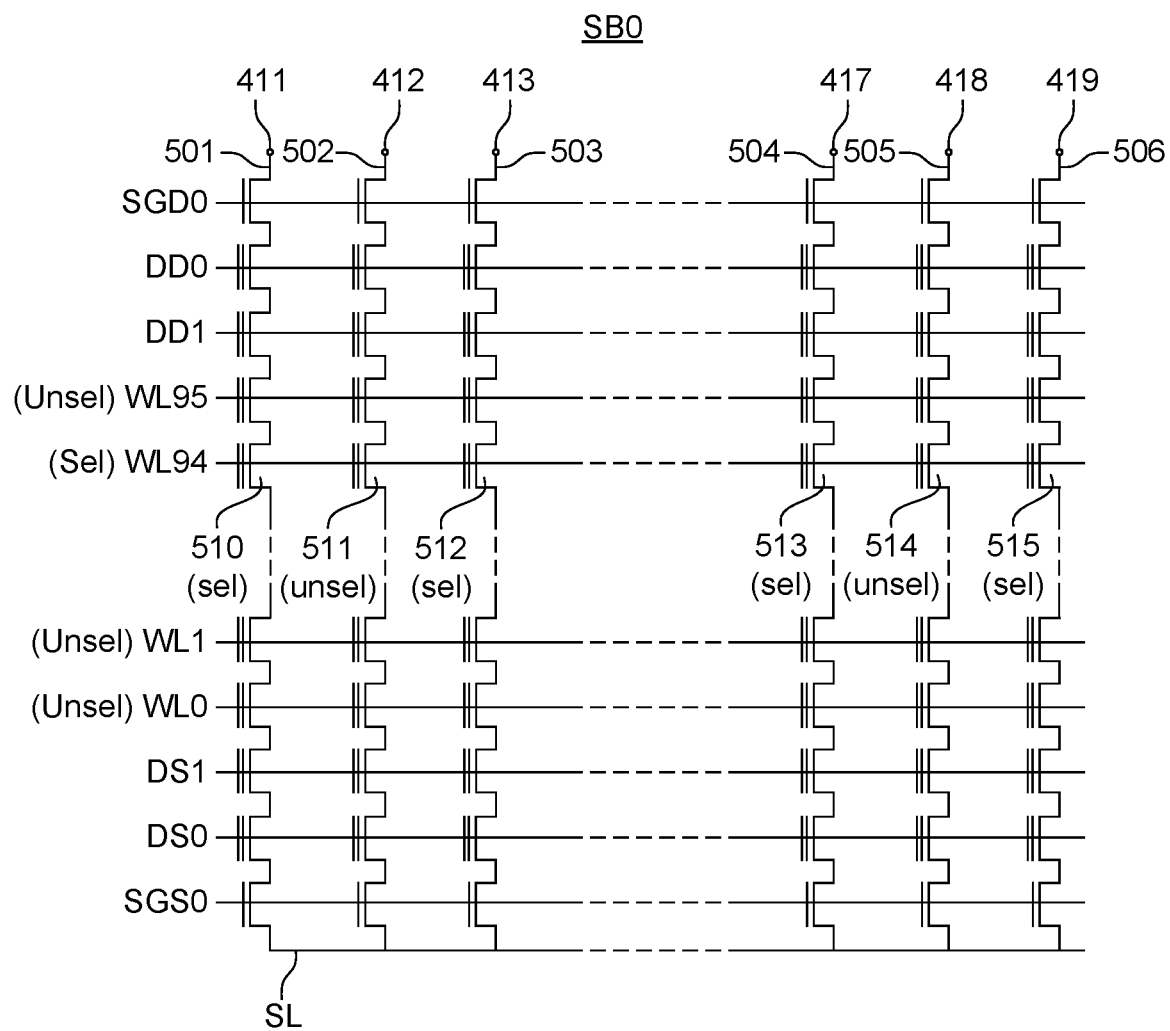
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
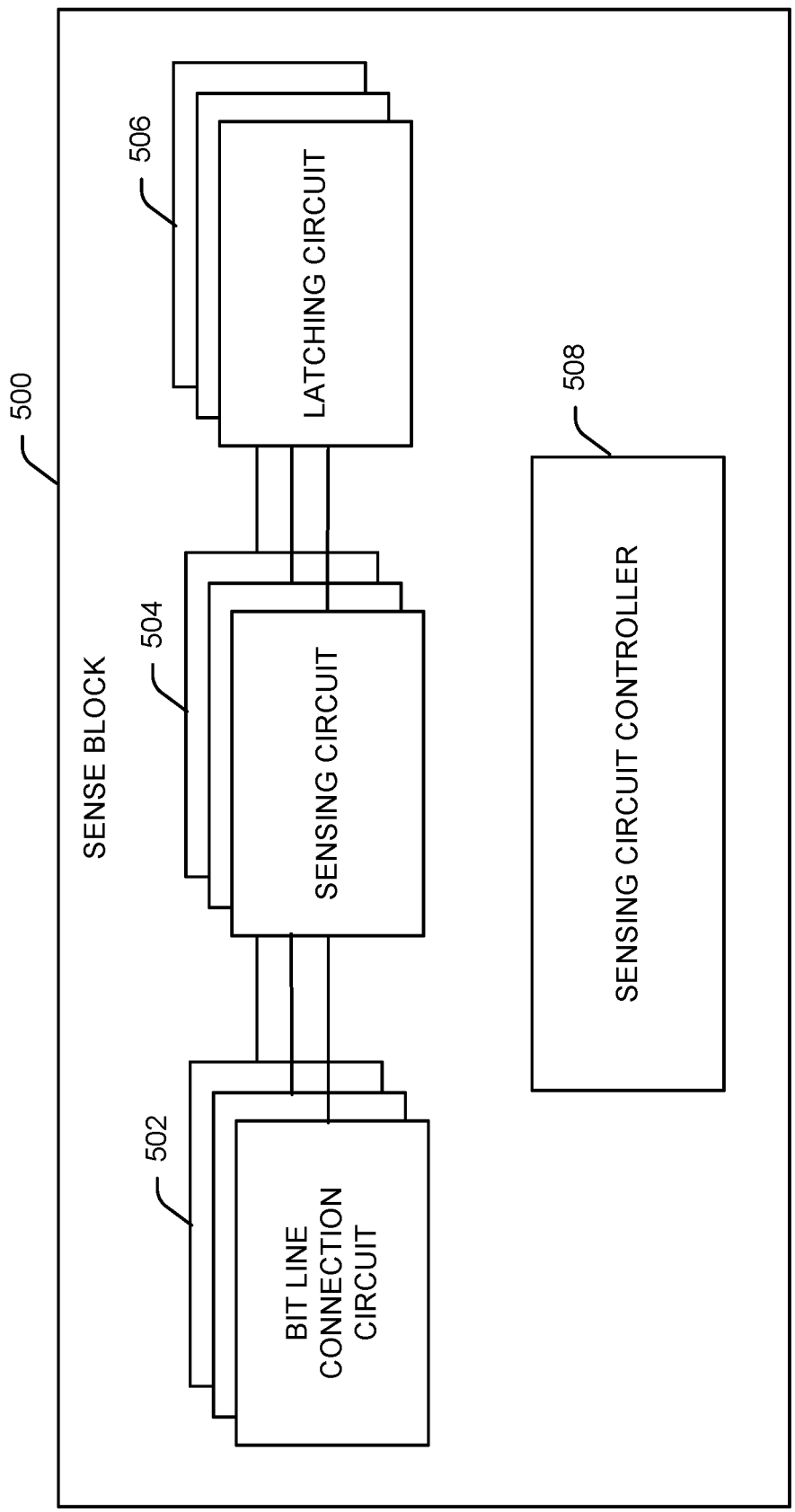
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16 k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is to be performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6A:
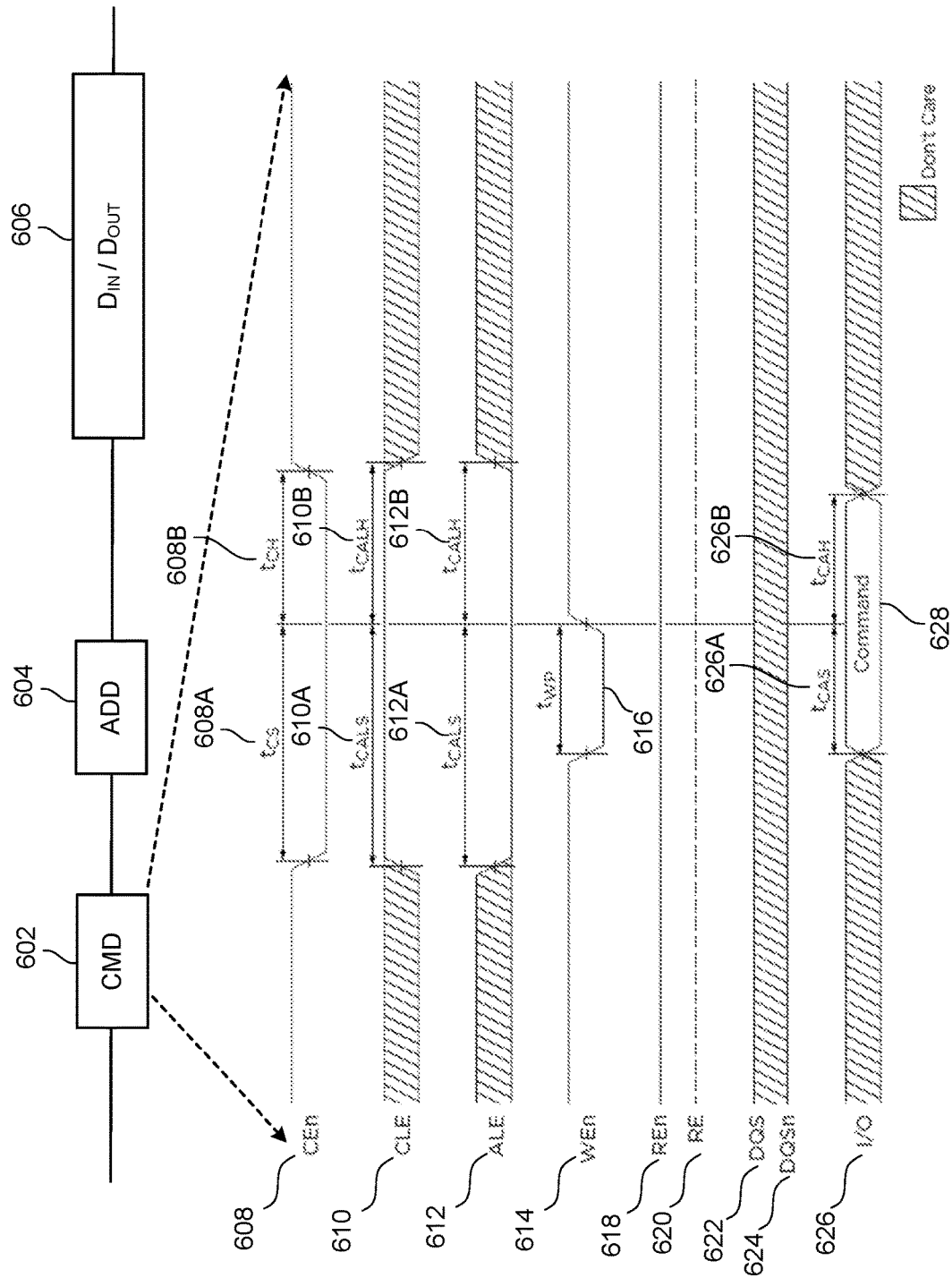
FIG. 6A schematically depicts a command phase of a command/address sequence associated with a read/write operation for a memory device.

FIG. 6A schematically depicts a command phase of a command/address sequence associated with a read/write operation for a memory device. More generally, FIG. 6A depicts a command/address sequence that includes a command phase 602 and an address phase 604. The command and address sequence is followed by DIN/DOUT operations 606. The command phase 602 is depicted in more detail in FIG. 6A. Various clock signals are also depicted, at least some of which are used to perform the command and address sequence. It should be appreciated that the character 'n' following the acronym used to represent a clock signal indicates that the clock signal is an active-low signal. Absence of the 'n' indicates that the signal is an active-high signal.

The signals include an active-low chip enable (CEn) signal 608, an active-high command latch enable (CLE) signal 610, an active-high address latch enable (ALE) signal 612, an active-low write enable (WEn) signal 614, an active-low read enable (REn) signal 618, an active-high read enable (RE) signal 620, an active-high data strobe (DQS) signal 622, and an active-low data strobe (DQSn) signal 624. Also depicted is an I/O bus 626.

As shown in FIG. 6A, each of the CEn signal 608, the CLE signal 610, and the ALE signal 612 may include a set-up time portion and a hold time portion when the signal goes high or low (depending on whether it is active-high or active-low). The set-up time portion may be a time window during which the memory device prepares to receive command information, address information, or data on the I/O bus, whichever the case may be. The hold time portion may be a time window during which the command information, address information, or data is received on the I/O bus.

Referring now to the various signals in more detail, the CEn signal 608 is an active-low signal. As shown, when the CEn signal 608 cycles low, the signal 608 includes a set-up time portion 608A and a hold time portion 608B. The CLE signal 610 and the ALE signal 612 are active-high signals.

As such, when the CLE signal 610 goes high, the signal 610 includes set-up time portion 610A and hold time portion 6106, and when the ALE signal 612 goes high, the signal 612 includes set-up time portion 612A and hold time portion 612B.

In operation, during the command phase 602, the CLE signal 610 becomes active (i.e., goes high) and the ALE signal 612 becomes inactive (i.e., goes low). In addition, the CEn signal 608—which as noted is an active-low signal—becomes active. The WEn signal 614—which is also an active-low signal—becomes active as well. During the respective set-up times 608A, 610A, 612A of the signals 608, 610, 612, as well as, during a set-up time portion 616 of the WEn signal 614, a set-up time portion 626A associated with receipt of the command information on the I/O bus 626 may occur. When the WEn signal 614 transitions to an inactive state (i.e., goes high), the signals 608, 610, 612 transition to respective hold time portions 608B, 610B, 612B. During these hold time portions, the command information 628 received on the I/O bus 626 may be latched during hold time portion 628B.

Figure 6B:
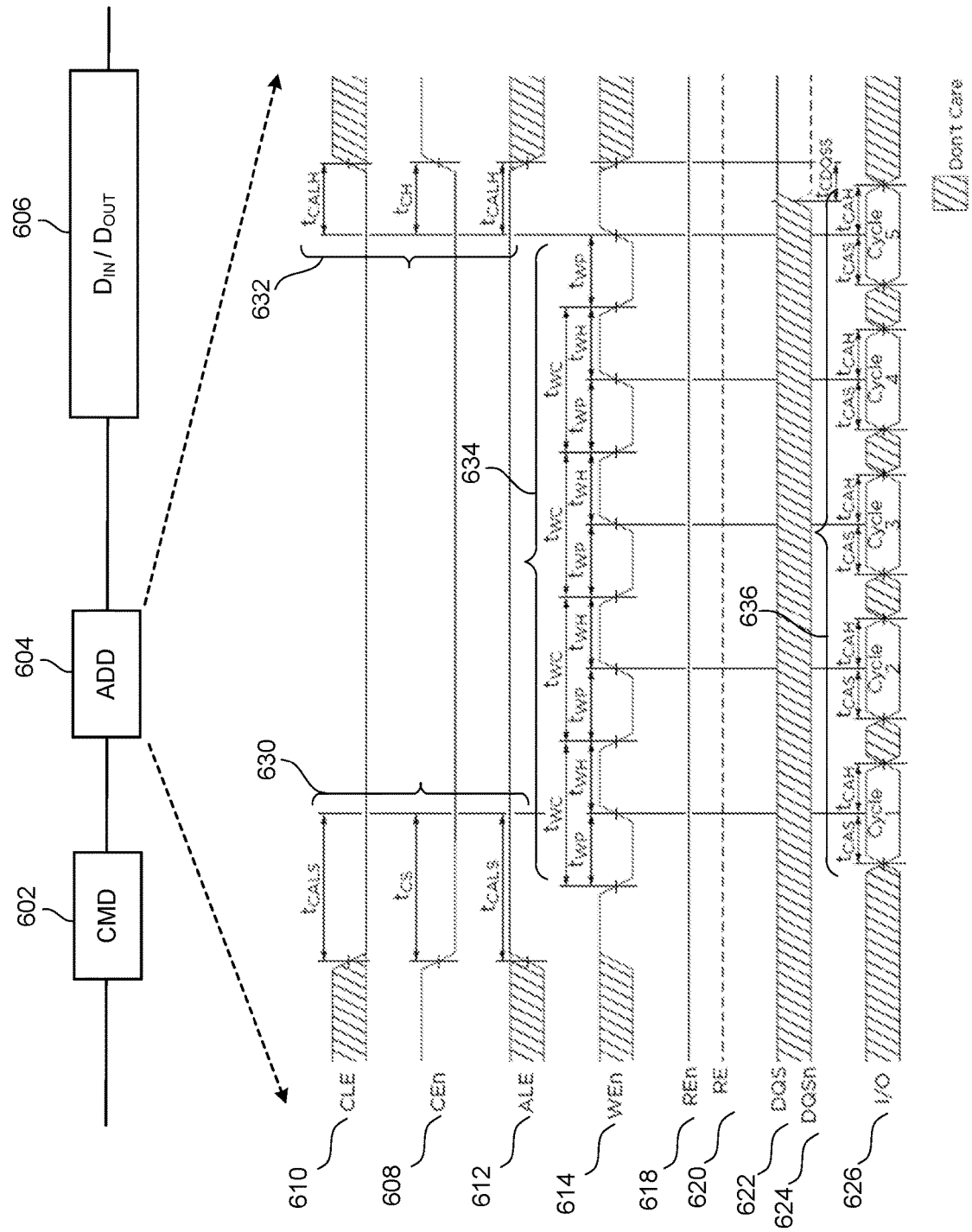
FIG. 6B schematically depicts an address phase of a command/address sequence associated with a read/write operation for a memory device.

FIG. 6B schematically depicts an address phase of a command/address sequence associated with a read/write operation for a memory device. FIG. 6B depicts the same command/address sequence as FIG. 6A, but focuses on the address phase 604 in more detail. As shown in FIG. 6B, during the address phase 604, the CLE signal 610 becomes inactive (i.e., goes low) and the ALE signal 612 becomes active (i.e., goes high). The CEn signal 608—which is an active-low signal—also becomes active (i.e., goes low). Respective set-up time portions 630 and hold time portions 632 corresponding to the signals, 608, 610, 612 are also depicted.

A series of clock cycles 634 of the WEn signal 614 may occur while the signals 608, 610, 612 are active. Each clock cycle of the WEn signal 614 may include a set-up time portion (twp) and a hold time portion (twH), that together form a cycle duration (twc). During the series of clock cycles 634, a series of address cycles 636 may occur during which address information is received on the I/O bus.

FIGS. 6A and 6B depict command and address sequences that require use of the I/O bus 626 to provide command/address information to a memory device. As such, when command or address information is received on the I/O bus 626, DIN/DOUT operations 606 cannot be performed on the I/O bus 626. Thus, even as DIN/DOUT speeds increase, the command and address sequences depicted in FIGS. 6A and 6B remain a bottleneck for system performance because they utilize the same I/O bus 626 to send command and address information to a memory device as the DIN/DOUT operations 606 use to provide data to and/or receive data from the memory device.

FIG. 7A schematically depicts a command/address sequence in accordance with example embodiments of the disclosed technology. The command/address sequence depicted in FIG. 7A utilizes various signals that are also used in connection with the existing command/address sequences depicted in FIGS. 6A and 6B, but employs them in a novel way that allows for the command/address sequence to be performed without requiring use of an I/O bus. More specifically, the command/address sequence encodes bit information on various signals, where the bit information can be decoded to obtain command and address codes, and thus, does not require the I/O bus to provide the command and address information. In contrast, the command/address sequence of FIGS. 6A and 6B does not encode bit information on these various signals, and thus, must utilize the I/O bus to provide the command and address information. As such, the command/address sequence of FIG. 7A can be performed in parallel with DIN/DOUT operations, thereby eliminating the bottleneck that the command/address sequence would otherwise have caused, and providing a technical improvement over the existing command/address sequences of FIGS. 6a and 6B, in the form of improved memory system performance.

FIG. 7A depicts an active-high CLE signal 702, an active-high ALE signal 704, and an active-low WEn signal 706. In example embodiments, bit information is encoded in the CLE signal 702 and the ALE signal 704, and a rising edge (or a falling edge) of the WEn signal 706 is used as a clock signal to latch the bit information encoded in the signal 702 and 704. More specifically, in example embodiments of the disclosed technology, a signal generator may generate the CLE signal 702 and the ALE signal 704. A clock generator (which may be same as or distinct from the signal generator that generates the enable signals 702 and 704) may generate the WEn signal 706. As shown in FIG. 7A, at each rising edge of the WEn signal 706, a controller (e.g., controller 122) may cause a bit value encoded in the CLE signal 702 to be latched. In this manner, a first bit pattern 708 may be obtained. Concurrently with obtaining the first bit pattern 708, the controller may cause a bit value encoded in the ALE signal 704 to be latched at each rising edge of the WEn signal 706. In this manner, a second bit pattern 710 may be obtained. While FIG. 7A depicts use of the rising edges of the WEn signal 706 to latch the respective bit information encoded in the CLE signal 702 and the ALE signal 704, it should be appreciated that in other embodiments, the falling edges of the WEn signal 706 may be used instead to latched the bit information encoded in the enable signals 702 and 704.

Figure 7B:
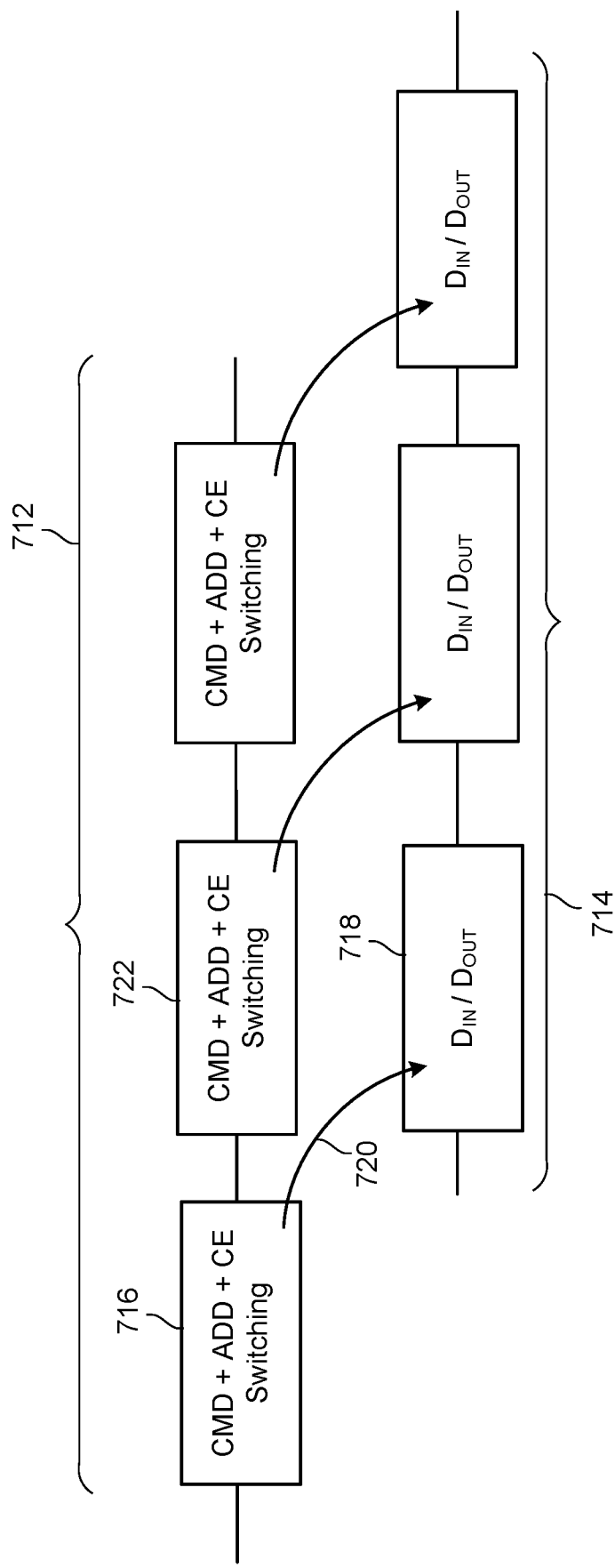
FIG. 7B schematically depicts a command/address sequence according to example embodiments of the disclosed technology being performed in parallel with a data IN (DIN)/data OUT (DOUT) operation.

In an example embodiment, the controller may be configured to decode the bit patterns obtained as described above to obtain command and address codes in connection with a read/write operation. More specifically, the controller may decode the first bit pattern 708 to obtain a command code and may decode the second bit pattern 710 to obtain an address code. For instance, the controller may decode the first bit pattern 708, which in the example of FIG. 7A is 0001 1000, as command code 18h, and the controller may decode the second bit pattern 710, which in the example of FIG. 7B is 1100 1010, as address code CAh. It should be appreciated that the particular bit patterns used to encode the command code and/or the address code may vary across embodiments of the disclosed technology. It should be further appreciated that the first bit pattern 708 and the second bit pattern 710 may be decoded serially. Alternatively, the bit patterns may be decoded in parallel because, as noted earlier, the I/O bus is not being used to send the command and address information to the memory device.

FIG. 7B schematically depicts a command/address sequence according to example embodiments of the disclosed technology being performed in parallel with a DIN/DOUT operation. A series 712 of command/address sequences are depicted. In addition, a series 714 of DIN/DOUT operations are depicted. Each command/address sequence 716 may be the command/address sequence schematically depicted in FIG. 7A. Each command/address sequence may be performed in parallel with a corresponding DIN/DOUT operation. More specifically, in example embodiments of the disclosed technology, while a DIN/DOUT operation corresponding to a current read/write operation is being performed on the I/O bus, a command/ address sequence corresponding to a next read/write operation may be performed in parallel.

As an example, the command/address sequence 722 may be performed in parallel with the DIN/DOUT operation 718. The DIN/DOUT operation 718 may correspond 720 to a prior command/address sequence 716 that was performed. More specifically, the prior command/address sequence 716 and the current DIN/DOUT operation 718 may both correspond to a same current read/write operation. The command/address sequence 722, on the other hand, may be associated with a next read/write operation, but may be performed in parallel with the DIN/DOUT operation 718 associated with the current read/write operation. The command/address sequence depicted in FIG. 7A according to example embodiments of the disclosed technology enables the parallelism depicted in FIG. 7B between the command/address sequencing and the DIN/DOUT operations. The command/address sequence of FIG. 7A can be employed in connection with any suitable memory device including, without limitation, static random access memory (SRAM), dynamic random access memory (DRAM), flash memory such as NAND flash, or any other suitable memory device.

Figure 8A:
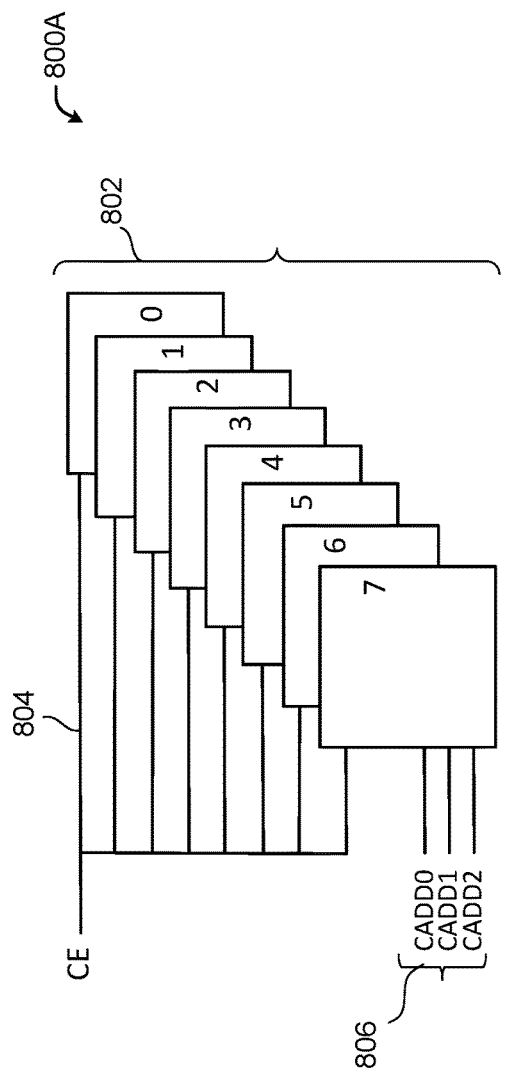
FIG. 8A schematically depicts a chip select configuration in which each memory chip within a memory package shares a common chip enable connection to a controller and includes hard-coded pins for enabling chip select.

FIG. 8A schematically depicts a chip select configuration 800A in which each memory chip within a memory package shares a common chip enable connection to a controller and includes hard-coded pins (e.g., hard wired) for enabling a chip select function. A set of memory chips/dies 802 is depicted. The terms memory chip and memory die may at times be used interchangeably herein. In addition, both the set of dies and an individual die may be referenced by the same numeral. The memory chips 802 may be provided within a memory package. While 8 dies are illustratively depicted, it should be appreciated that more or less dies may be included in a package.

In the configuration 800A depicted in FIG. 8A, each die 802 shares a common chip enable (CE) connection 804 to a controller. For instance, respective pins from the set of chips 802 may connect to a shared pin 804 that connects to a controller. In addition, each die 802 may include a set of hard-coded pins 806. The respective set of hard-coded pins 806 for each die 802 may be encode with a particular bit pattern that corresponds to only that die. For instance, assuming the set of dies 802 includes 8 dies, each set of hard-coded pins 806 may encode a respective corresponding 3-bit value that is used to select the corresponding die 802.

Figure 8B:
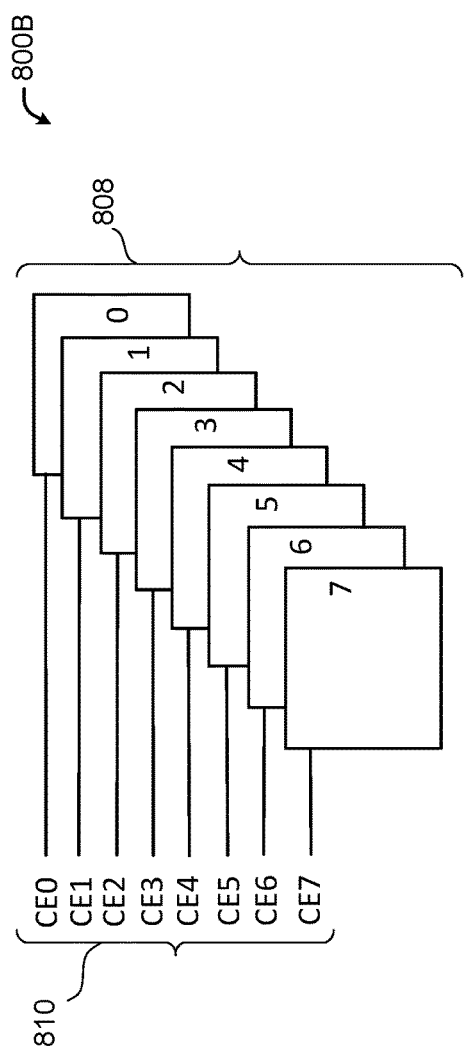
FIG. 8B schematically depicts an alternative chip select configuration in which each memory chip within a memory package has a dedicated chip enable connection to a controller.

FIG. 8B schematically depicts an alternative chip select configuration 800B in which each memory chip within a memory package has a dedicated CE connection to a controller. A set of memory chips/dies 808 is depicted. Similar to the memory chips 802, the memory chips 808 may be provided within a memory package. While 8 dies are illustratively depicted, it should be appreciated that more or less dies may be included in a package. In the configuration 800B depicted in FIG. 8B, each die 808 has a dedicated CE connection to a controller. As a result of the dedicated CE connections 810 to the controller in the configuration 800B, each die 808 does not include or have a need for the set of hard-coded pins 806 that are provided for each of the dies 802 in the configuration 800A of FIG. 8A.

While the configuration 800A of FIG. 8A benefits from having only one CE connection to the controller for the entire die package, it suffers from a number of technical drawbacks. Among these is that the die switching is preset (as defined by the set of hard-coded pins 806 for each die), and thus, not flexible. In addition, by virtue of each die 802 including the set of hard-coded pins 806, each die has a greater number of pins (e.g., 4 in the case of a die package that includes 8 dies) than in the configuration 800B of FIG. 8B. Moreover, as a result of the set of hard-coded pins 806 being provided for each die, even if all CEs are low, the die package may still burn unnecessary system power. The configuration 800B of FIG. 8B, however, also suffers from various technical drawbacks. While the configuration 800B allows for fast and flexible die switching by virtue of each die 808 have a dedicated CE connection to the controller, the configuration 800B is also wasteful because 8 (assuming the die package includes 8 dies) CE connections must now be provided.

Figure 9A:
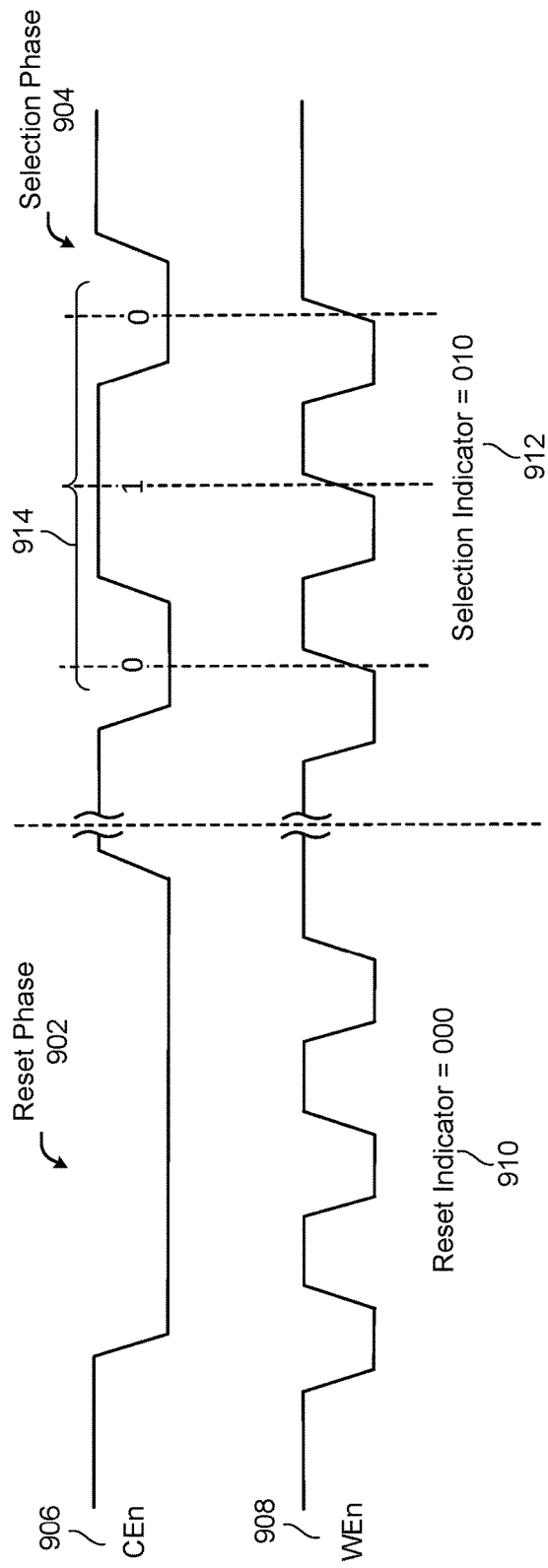
FIG. 9A schematically depicts a chip select sequence in accordance with example embodiments of the disclosed technology.

FIG. 9A schematically depicts a chip select sequence in accordance with example embodiments of the disclosed technology. Similar to the command/address sequence illustratively depicted in FIG. 7A, in example embodiments, the chip select sequence of FIG. 9A does not require an I/O bus, and thus, can be performed in parallel with DIN/DOUT operations. The chip select sequence of FIG. 9A may be performed independently of the command/address sequence of FIG. 7A, or together in connection with a same read/write operation.

An active-low CEn signal 906 and an active-low WEn signal 908 are depicted in FIG. 9A. During a reset phase 902, a controller may utilize the WEn signal 908 to determine bit information that is encoded in the CEn signal 906. More specifically, at each rising edge of the WEn signal 908, the controller may cause a bit value encoded in the CEn signal 906 to be latched. In this manner, a first bit pattern is obtained during the reset phase 902. It should be appreciated that, in other embodiments, bit information encoded in the CEn signal 906 may be latched—whether during the reset phase 902 or the selection phase 904 (described in more detail hereinafter)—at falling edges of the WEn signal 908 instead.

The controller may compare the first bit pattern to a predetermined reset indicator 910. If the first bit pattern does not match the reset indicator 910, the controller may continue to cause bit values encoded in the CEn signal 902 to be latched at rising or falling edges of the WEn signal 908. The controller may continue to obtain the first bit pattern and check it against the reset indicator 910 until a match is indicated.

Upon determining that the first bit pattern matches the reset indicator 910, the chip select sequence may transition from a reset phase 902 to a selection phase 904. During the selection phase, the controller may again cause bit information encoded in the CEn signal 906 to be latched at each rising (or falling) edge of the WEn signal 908 in order to obtain a second bit pattern 914. The controller may then compare the second bit pattern 914 to a mapping of selection indicators to memory dies, where each selection indicator 912 is a bit pattern that uniquely identifies a particular memory die within a die package. In the example of FIG. 9A, the second bit pattern 914 matches the selection indicator 010, and would result in the memory chip corresponding to this selection indicator becoming enabled.

Upon determining that the first bit pattern matches the reset indicator 910, the chip select sequence may transition from a reset phase 902 to a selection phase 904. During the selection phase, the controller may again cause bit information encoded in the CEn signal 906 to be latched at each rising (or falling) edge of the WEn clock signal 908 in order to obtain a second bit pattern 914. The controller may then compare the second bit pattern 914 to a mapping of selection indicators to memory dies, where each selection indicator 912 is a bit pattern that uniquely identifies a particular memory die within a die package. In the example of FIG.

9A, the second bit pattern 914 matches the selection indicator 010, and would result in the memory chip corresponding to this selection indicator becoming enabled.

Figure 9B:
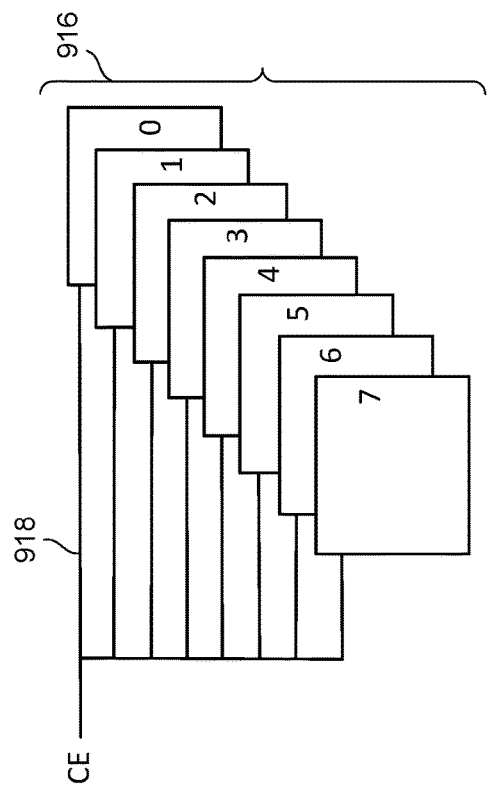
FIG. 9B schematically depicts a chip select configuration associated with the chip select sequence of FIG. 9A in accordance with example embodiments of the disclosed technology.

FIG. 9B schematically depicts a chip select configuration associated with the chip select sequence of FIG. 9A in accordance with example embodiments of the disclosed technology. The configuration depicted in FIG. 9B includes a set of memory dies 916 (e.g., 8) forming a die package. The configuration of FIG. 9B has the technical benefit offered by the configuration 800A of all dies are sharing a common CE connection 918 to a controller, but without the technical drawback of a set of hard-coded pins having to be provided for each die. In particular, the configuration depicted in FIG. 9B employs the chip select sequence of FIG. 9A, and thus, achieves the fast and flexible die switching of the configuration 800B of FIG. 8B, but does so using an encoding methodology that does not require the multiple individual CE connections that the configuration 800B requires. That is, each die in the configuration of FIG. 9B has on 1 CE pin. Thus, by utilizing the chip select sequence of FIG. 9A according to example embodiments of the disclosed technology, the best of both worlds is achievable so to speak. In particular, the technical benefits of each configuration 900A and 900B is achieved without the corresponding technical drawbacks of each configuration.

Figure 10:
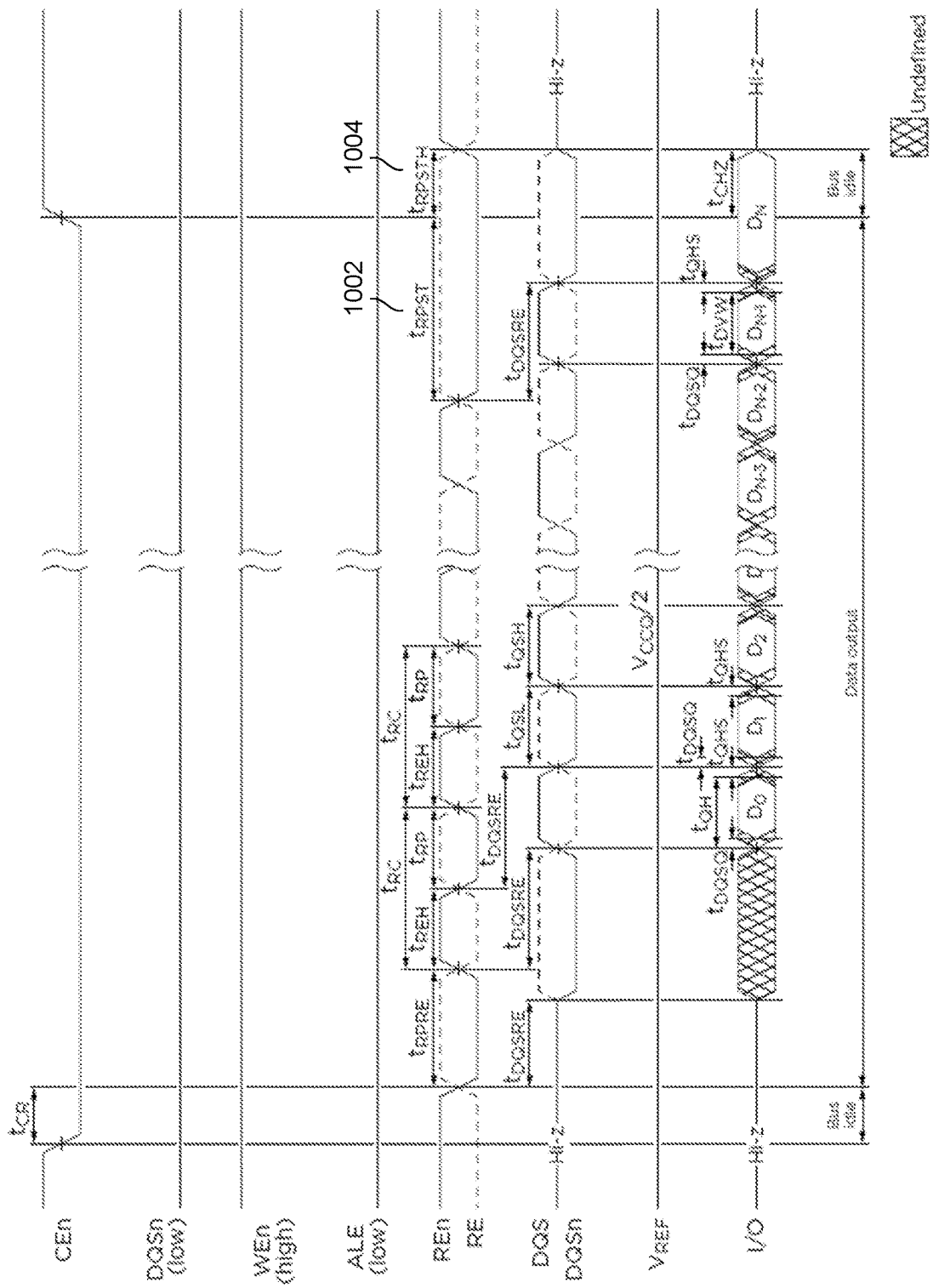
FIG. 10 schematically depicts time windows during which the chip select sequence can be performed in accordance with example embodiments of the disclosed technology.

FIG. 10 schematically depicts time windows during which the chip select sequence can be performed in accordance with example embodiments of the disclosed technology. In particular, FIG. 10 depicts existing time windows 1002 and 1004 that may occur during a read operation. In example embodiments, the chip select sequence of FIG. 9A may be performed during these existing time windows so as not to add additional time delay. More specifically, the reset phase 900A of the chip select sequence may be performed during time window 1002 and the selection phase 900B of the chip select sequence may be performed during time window 1004.

Figure 11:
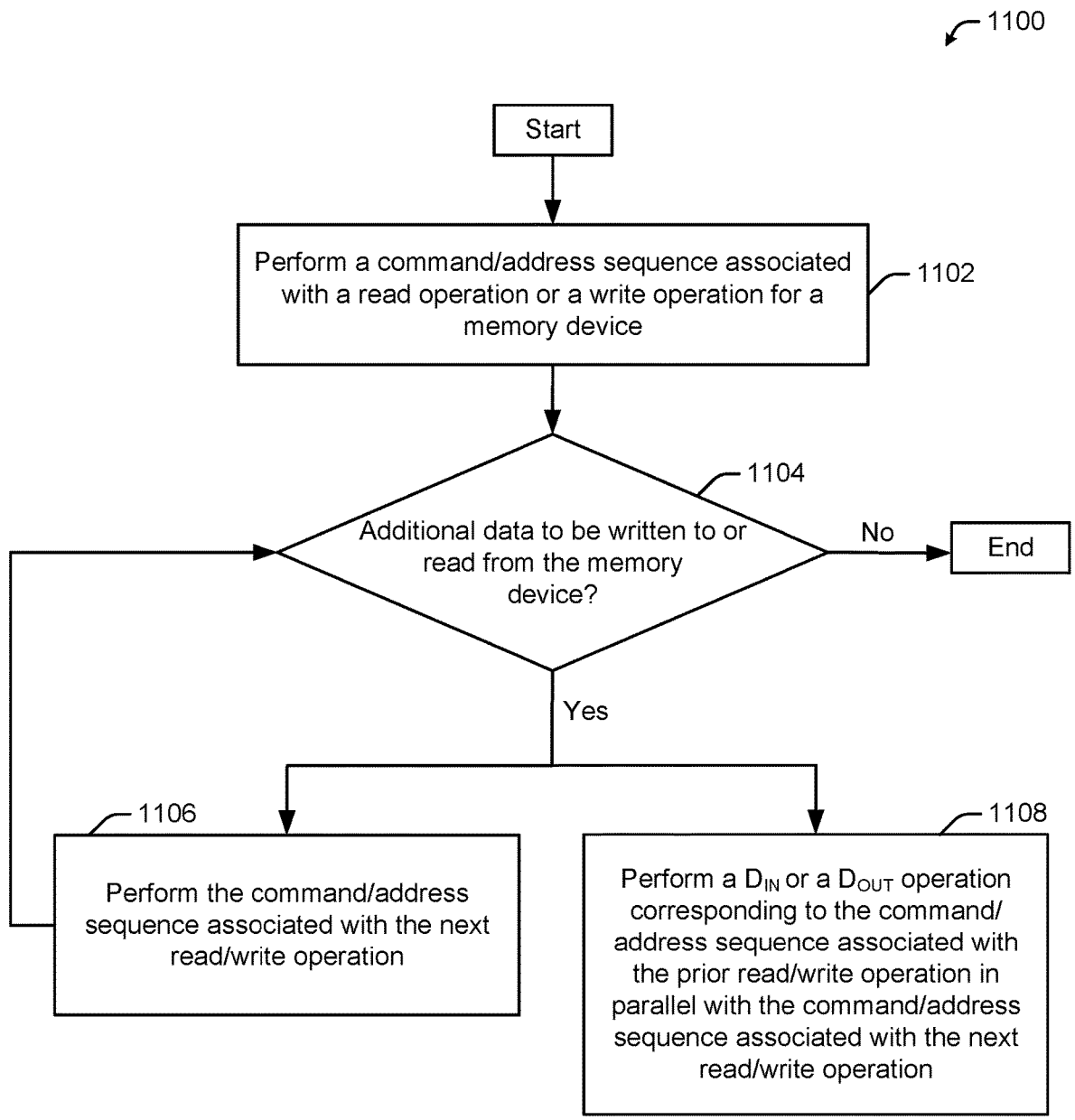
FIG. 11 is a flowchart of an illustrative method according to example embodiments of the disclosed technology.
Figure 12:
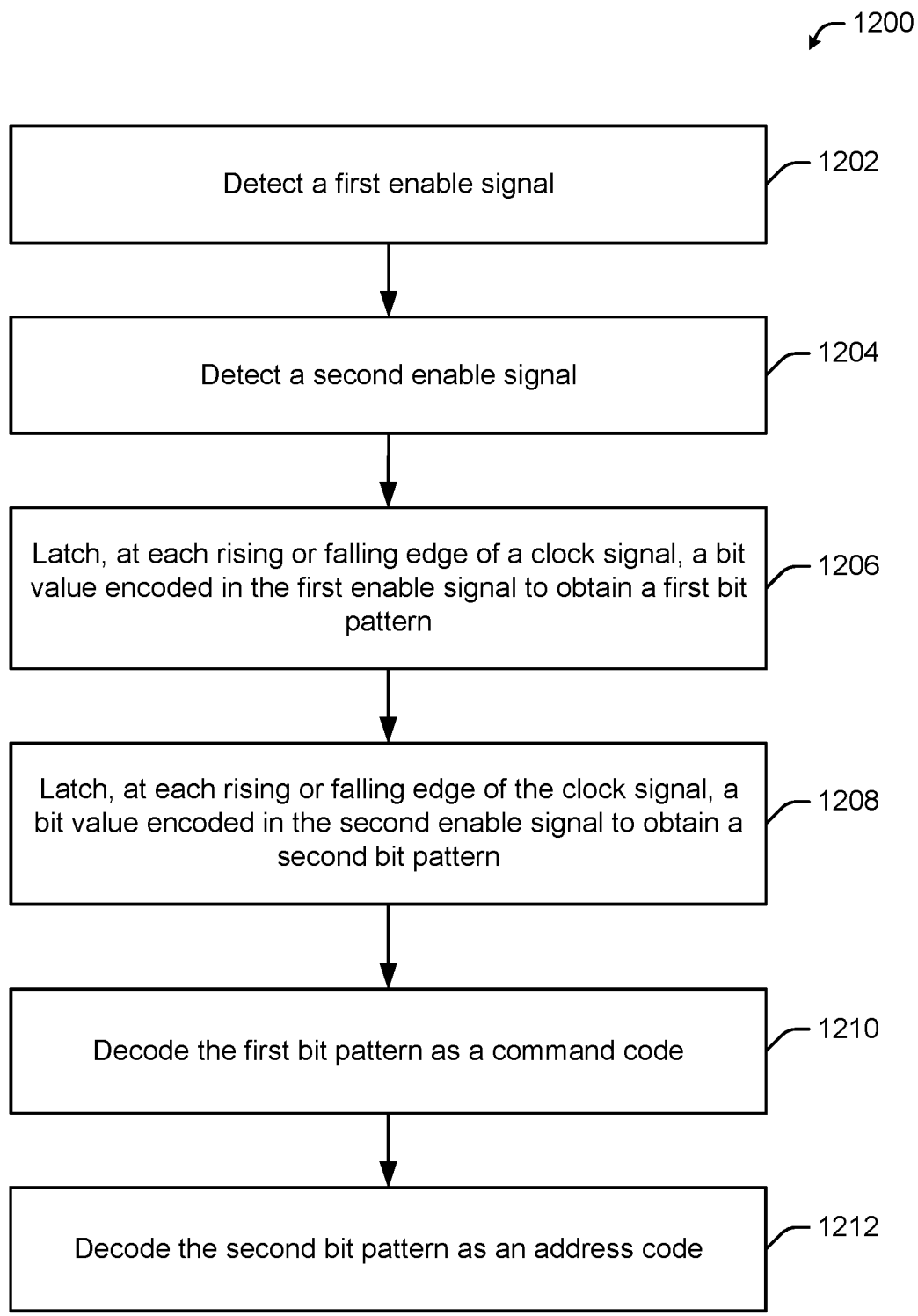
FIG. 12 is a flowchart of an illustrative method for performing a command/address sequence according to example embodiments of the disclosed technology.
Figure 13:
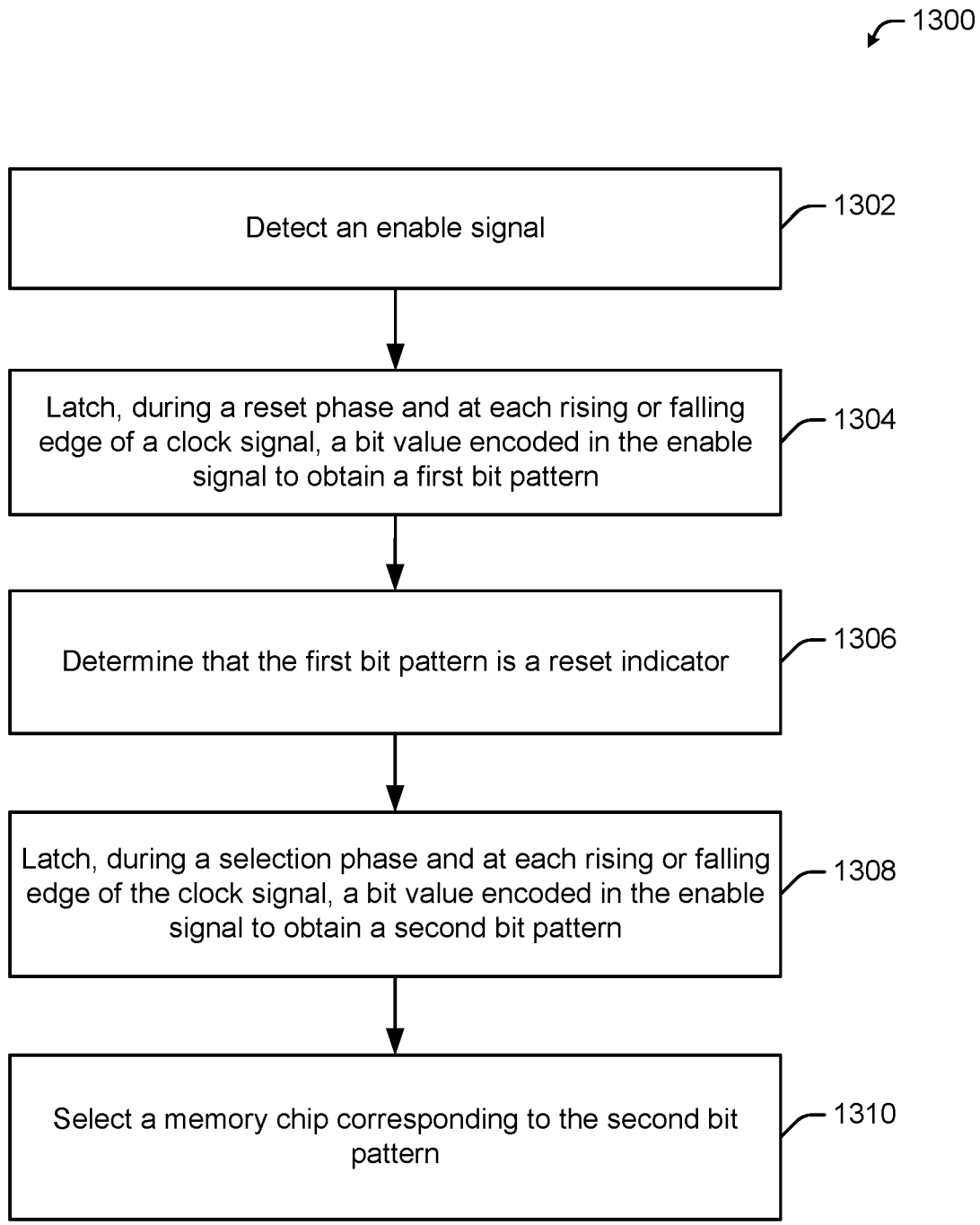
FIG. 13 is a flowchart of an illustrative method for performing a chip select sequence according to example embodiments of the disclosed technology.

FIG. 11 is a flowchart of an illustrative method 1100 according to example embodiments of the disclosed technology. FIG. 12 is a flowchart of an illustrative method 1200 for performing a command/address sequence according to example embodiments of the disclosed technology. FIG. 13 is a flowchart of an illustrative method 1300 for performing a chip select sequence according to example embodiments of the disclosed technology. The method 1100, the method 1200, and/or the method 1300 may be performed by a controller such as controller 122 (FIG. 1). More generally, the methods 1100, 1200, and/or 1300 may be performed by any volatile or non-volatile memory system configured to interface with a memory device such as a NAND device (or that is embedded therein) including, without limitation, a separately provided DRAM, an embedded microcontroller, or the like. In some embodiments, the instructions for performing the method 1100, the instructions for performing the method 1200, and/or the instructions for performing the method 1300 may be hardwired or fused into the memory core.

Referring now to FIG. 11, at block 1102 of the method 1100, a command/address sequence associated with a read/write operation is performed for a memory device. The command/address sequence may be that depicted in FIG. 7A, for example. At block 1104 of the method 1100, a determination may be made as to whether any additional data is to be written to or read from the memory device. For instance, the determination at block 1104 may be a determination as to whether there are any additional read/write operations to perform.

In response to a negative determination at block 1104, the method 1100 may end. On the other hand, in response to a positive determination at block 1104, the method 1100 may proceed to blocks 1106 and 1108. At block 1106 of the method 1100, a command/address sequence associated with a next read/write operation may be performed. Further, at block 1108 of the method 110, a DIN/DOUT operation corresponding to the command/address sequence associated with the prior read/write operation may be performed in parallel with the command/address sequence performed at block 1106.

Referring now to FIG. 12, at block 1202 of the method 1200, a first enable signal is detected. At block 1204 of the method 1200, a second enable signal is detected. In example embodiments, a signal generator may generate the first and second enable signals, which may be a CLE signal and an ALE signal, respectively. At block 1206 of the method 1200, a bit value encoded in the first enable signal may be latched at each rising (or falling) edge of a clock signal to obtain a first bit pattern. The clock signal may be a WEn signal, for example. Further, at block 1208 of the method 1200, a bit value encoded in the second enable signal may be latched at each rising (or falling) edge of the clock signal to obtain a second bit pattern. Then, at block 1210 of the method 1200, the first bit pattern may be decoded to obtain a command code, and at block 1212 of the method 1200, the second bit pattern may be decoded to obtain an address code. In some embodiments, the decoding operations performed at blocks 1210 and 1212 may be performed in parallel because the I/O bus is not being used to obtain the command and address information.

Referring now to FIG. 13, at block 1302 of the method 1300, an enable signal is detected. The enable signal may be a CEn signal, for example. At block 1304 of the method 1300, during a reset phase of a chip select sequence, a bit value encoded in the enable signal may be latched at each rising (or falling) edge of a clock signal to obtain a first bit pattern. The clock signal may be a WEn signal, for example. At block 1306 of the method 1300, the first bit pattern may be determined to match a reset indicator. In some embodiments, the reset indicator may be configurable to be any desired bit pattern. Upon determining that the first bit pattern matches the reset indicator, the chip select sequence may transition from the reset phase to a selection phase.

At block 1308 of the method 1300, during a selection phase, a bit value encoded in the enable signal may be latched at each rising (or falling) edge of the clock signal to obtain a second bit pattern. Then, at block 1310 of the method 1300, the memory chip/die having a predefined associated with a selection indicator that matches the second bit pattern may be selected by the chip enable function.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In an embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in an embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A method of performing a command/address sequence associated with a read/write operation for a memory device, the method comprising:
    detecting a command latch enable signal;
    detecting a address latch enable signal;
    latching, at each rising or falling edge of a clock signal, a bit value encoded in the command latch enable signal to obtain a first bit pattern;
    latching, at each rising or falling edge of the clock signal, a bit value encoded in the address latch enable signal to obtain a second bit pattern;
    decoding the first bit pattern as a command code; and
    decoding the second bit pattern as an address code.

2. The method of claim 1, wherein the command/address sequence is performed in parallel with a DIN or a DOUT operation corresponding to a prior command/address sequence associated with a prior read/write operation.

3. The method of claim 1, wherein the command/address sequence is independent of an input/output (I/O) bus of the memory device.

4. The method of claim 1, wherein latching the bit value encoded in the command latch enable signal comprises latching the bit value encoded in the command latch enable signal at least partially concurrently with latching the bit value encoded in the address latch enable signal.

5. The method of claim 1, wherein a write enable signal is used as the clock signal.

6. A controller for performing a command/address sequence associated with a read/write operation for a memory device, the controller comprising circuitry operative to:
    detect a command latch enable signal and a address latch enable signal;
    cause, at each rising or falling edge of a clock signal, a bit value encoded in the command latch enable signal to be latched to obtain a first bit pattern;
    cause, at each rising or falling edge of the clock signal, a bit value encoded in the address latch enable signal to be latched to obtain a second bit pattern;
    decode the first bit pattern as a command code; and
    decode the second bit pattern as an address code.

7. The controller of claim 6, wherein the command/address sequence is performed in parallel with a DIN or a DOUT operation corresponding to a prior command/address sequence associated with a prior read/write operation.

8. The controller of claim 6, wherein the command/address sequence is independent of an input/output (I/O) bus of the memory device.

9. The controller of claim 6, wherein the controller is configured to cause the bit value encoded in the command latch enable signal to be latched at least partially concurrently with latching of the bit value encoded in the address latch enable signal.

10. The controller of claim 6, wherein a write enable signal is used as the clock signal.

11. A memory die package, comprising:
    a plurality of memory dies; and
    a controller configured to:
        detect a chip enable signal;
        latch, at each rising or falling edge of a clock signal, a bit value encoded in the chip enable signal to obtain bit information; and
        execute a chip select sequence to identify and select, based on decoding the bit information, a particular memory die among the plurality of memory dies.

12. The memory die package of claim 11, wherein the plurality of memory dies share a common connection to the controller.

13. The memory die package of claim 11, wherein the chip select sequence executed by the controller comprises:
    obtain obtaining a first bit pattern based on latching the bit values encoded in the chip enable signal;
    determining that the first bit pattern is a reset indicator;
    responsive to determining that the first bit pattern is the reset indicator, latching, at each rising or falling edge of the clock signal, a bit value encoded in the chip enable signal to obtain a second bit pattern; and
    selecting the particular memory die based on a correspondence of the particular memory die to the second bit pattern.

14. The memory die package of claim 13, wherein the correspondence between the particular memory die and the second bit pattern is a predefined association between the particular memory die and the second bit pattern.

15. The memory die package of claim 13, wherein the controller executes the chip select sequence in parallel with at least one of: i) a command/address sequence associated with a current read/write operation or ii) a DIN or a DOUT operation corresponding to a prior command/address sequence associated with a prior read/write operation.

16. The memory die package of claim 13, wherein a write enable signal is used as the clock signal.

* * * * *